(12) United States Patent
Sprenger et al.

(10) Patent No.: US 9,451,716 B1
(45) Date of Patent: Sep. 20, 2016

(54) SERVICEABLE CHASSIS FOR DEVICES

(71) Applicant: Intel Corporation, Santa Clara, CA (US)

(72) Inventors: Mark E. Sprenger, Folsom, CA (US); Ralph V. Miele, Hillsboro, OR (US); David Pidwerbecki, Hillsboro, OR (US); Kenan Huseyin Arik, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/752,927

(22) Filed: Jun. 27, 2015

(51) Int. Cl.
*G06F 1/16* (2006.01)
*H05K 5/02* (2006.01)
*H05K 5/00* (2006.01)
*H05K 5/03* (2006.01)

(52) U.S. Cl.
CPC .......... *H05K 5/0221* (2013.01); *G06F 1/1656* (2013.01); *H05K 5/0004* (2013.01); *H05K 5/03* (2013.01)

(58) Field of Classification Search
CPC .... G06F 1/1656; G06F 1/1679; G06F 1/181; H05K 5/0004; H05K 5/0221; H05K 5/03
USPC ..................................... 361/679.58
See application file for complete search history.

(56) References Cited

U.S. PATENT DOCUMENTS

| | | | | |
|---|---|---|---|---|
| 5,826,922 A * | 10/1998 | Wernig | ............ | E05C 9/041 292/172 |
| 6,068,307 A * | 5/2000 | Murphy | ............. | G06F 1/1616 292/300 |
| 6,314,274 B1 * | 11/2001 | Kumagai | ............ | H04M 1/0214 361/679.13 |
| 6,356,436 B1 * | 3/2002 | Buican | ............ | G06F 1/181 312/216 |
| 6,705,891 B1 * | 3/2004 | Lin | ............ | G11B 33/02 439/501 |
| 6,736,661 B2 * | 5/2004 | Homer | ............ | H01R 13/60 439/344 |
| 7,484,778 B2 * | 2/2009 | Chen | ............ | G06F 1/1616 292/118 |
| 7,523,975 B2 * | 4/2009 | Chaloupka | ............ | B60R 7/04 220/264 |
| 9,146,588 B2 * | 9/2015 | Kole | ............ | H04M 1/0249 |
| 9,215,817 B1 * | 12/2015 | Cohen | ............ | H05K 5/0221 |
| 2004/0127270 A1 * | 7/2004 | Wulff | ............ | H04B 1/3833 455/575.4 |
| 2004/0203518 A1 * | 10/2004 | Zheng | ............ | H04M 1/0252 455/90.3 |
| 2005/0231898 A1 * | 10/2005 | Sura | ............ | G06F 1/181 361/679.58 |
| 2006/0027697 A1 * | 2/2006 | Gojanovic | ............ | B65H 75/4434 242/388.1 |
| 2006/0139856 A1 * | 6/2006 | Liu | ............ | H01M 2/1066 361/600 |
| 2008/0227380 A1 * | 9/2008 | Hsu | ............ | G11B 33/025 454/184 |
| 2010/0320883 A1 * | 12/2010 | Yang | ............ | G06F 1/181 312/223.1 |
| 2011/0107359 A1 * | 5/2011 | Lee | ............ | G11B 33/025 720/600 |
| 2011/0170249 A1 * | 7/2011 | Nunes | ............ | G01D 9/005 361/679.01 |

* cited by examiner

Primary Examiner — Adrian S Wilson
(74) Attorney, Agent, or Firm — Patent Capital Group

(57) ABSTRACT

Particular embodiments described herein provide for a serviceable chassis. The serviceable chassis can include a first housing and a second housing. The first housing includes a locking arm. The second housing can include a locking cam and a cord. The cord is attached to the locking cam and can rotate the locking cam to engage and disengage the locking arm to couple and uncouple the first housing to the second housing.

20 Claims, 11 Drawing Sheets

SERVICEABLE CHASSIS FOR DEVICES

TECHNICAL FIELD

Embodiments described herein generally relate to hinge configurations for a serviceable chassis for devices.

BACKGROUND

End users have more electronic device choices than ever before. A number of prominent technological trends are currently afoot (e.g., more computing devices, thinner computing devices, more aesthetically pleasing computing devices, etc.), and these trends are changing the electronic device landscape. One of the technological trends is to have a sleek, smooth, aesthetically pleasing device. However, the chassis of computing devices needs to be in two or more pieces so the electronics inside the computing device are accessible. Hence, there is a challenge in providing a sleek, smooth, aesthetically pleasing design while still allowing access to the electronics inside a computing device.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

The FIGURES of the drawings are not necessarily drawn to scale, as their dimensions can be varied considerably without departing from the scope of the present disclosure.

DETAILED DESCRIPTION OF EXAMPLE EMBODIMENTS

Example Embodiments

The following detailed description sets forth example embodiments of apparatuses, methods, and systems relating to hinge configurations for an electronic device. Features such as structure(s), function(s), and/or characteristic(s), for example, are described with reference to one embodiment as a matter of convenience; various embodiments may be implemented with any suitable one or more of the described features.

Figure 1A:
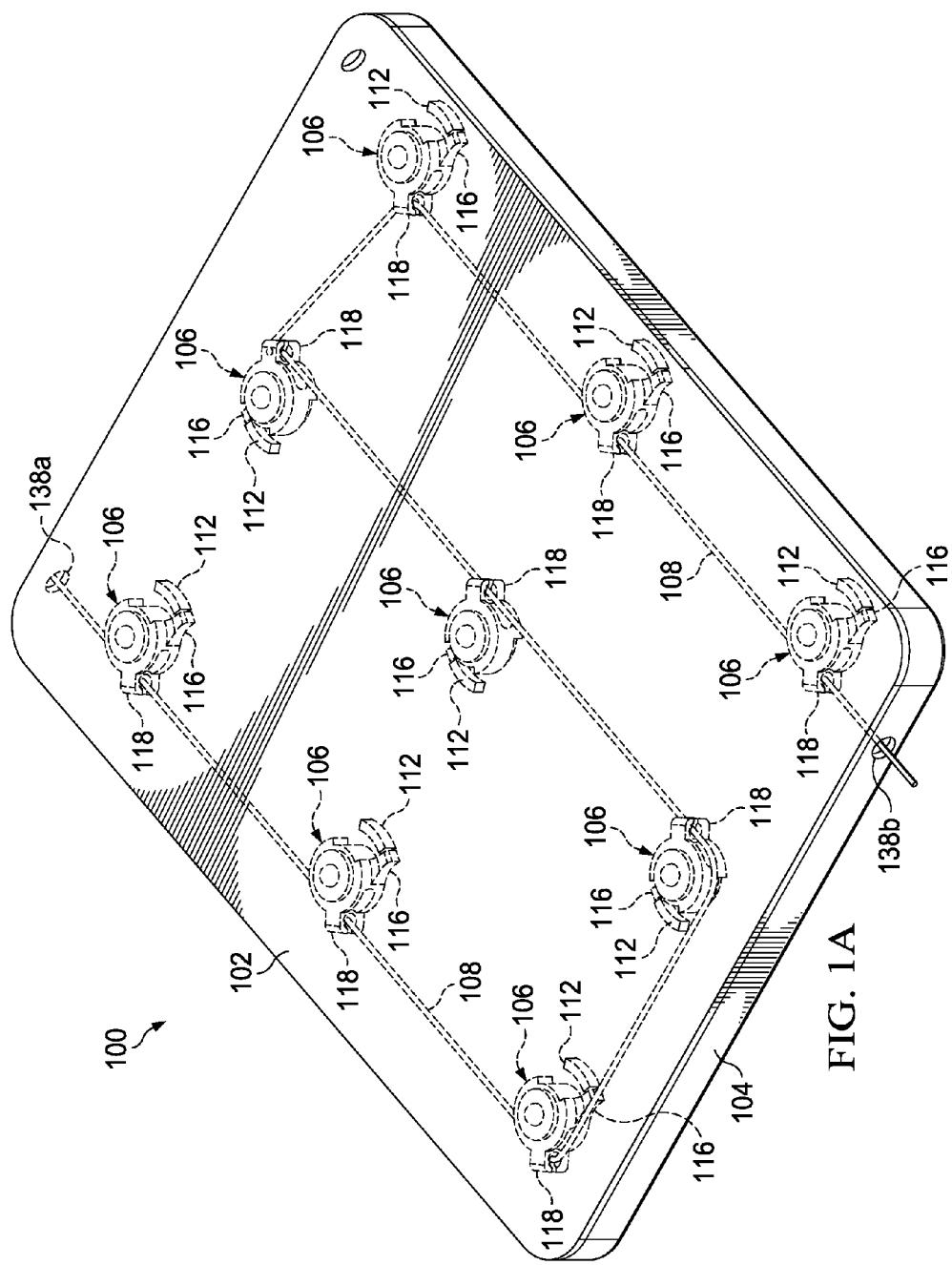
FIG. 1A is a simplified schematic diagram illustrating an orthographic view of a serviceable chassis for a device, in accordance with one embodiment of the present disclosure.
Figure 1B:
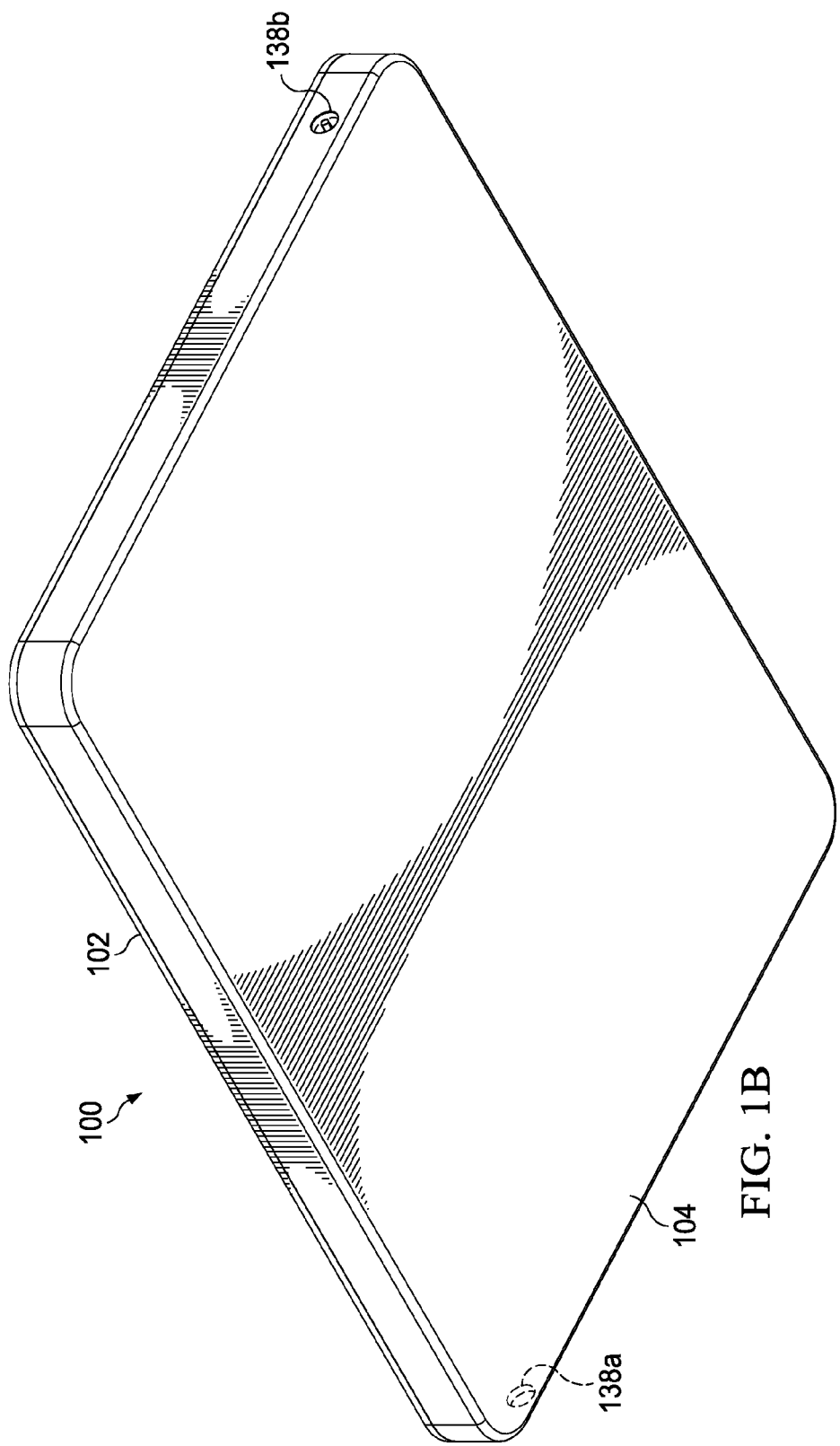
FIG. 1B is a simplified schematic diagram illustrating an orthographic view of a serviceable chassis for a device, in accordance with one embodiment of the present disclosure.

FIG. 1A is a simplified orthographic diagram of a serviceable chassis 100 that includes a first housing 102 and a second housing 104. Second housing 104 can include one or more locking cams 106, cord 108, a stop feature 112, and cord attachments 138a and 138b. Each locking cam 106 can include a backstop 116 and a rotation arm 118. In an example, cord 108 can be coupled to each locking cam 106 using rotation arm 118. When cord 108 is pulled one direction or the other, locking cam 106 can rotate. Stop feature 112 can engaged with backstop 118 and prevent locking cam 106 from rotating past a predetermined distance. As illustrated in FIG. 1A, cord 108 has been secured to cord attachment 138, coupled to each locking each locking cam 106 using rotation arm 118, and is protruding from cord attachment 138b Turning to FIG. 1B, FIG. 1B is a simplified orthographic diagram of a serviceable chassis 100. As illustrated in FIG. 1B, the portion of cord 108 that was protruding from cord attachment 138b has been cut. This results in a clean profile of serviceable chassis without screw holes or obvious attachment areas. When access to the inside of serviceable chassis 100 is desired, cord attachment 138a or 138b can be accessed and used to pull on cord 108. The pulling on cord 108 will rotate each locking cam 106 and release first housing 102 from second housing 104.

The foregoing is offered by way of non-limiting examples in which the system and method of the present specification may usefully be deployed. The following disclosure provides many different embodiments, or examples, for implementing different features of the present disclosure. Specific examples of components and arrangements are described below to simplify the present disclosure. These are, of course, merely examples and are not intended to be limiting. Further, the present disclosure may repeat reference numerals and/or letters in the various examples. This repetition is for the purpose of simplicity and clarity and does not in itself dictate a relationship between the various embodiments and/or configurations discussed. Different embodiment many have different advantages, and no particular advantage is necessarily required of any embodiment.

Particular embodiments described herein provide for a serviceable chassis 100. Serviceable chassis 100 can be a chassis for an electronic device such as a notebook computer, laptop, cellphone, or other mobile device that includes a circuit board coupled to a plurality of electronic components (which includes any type of components, elements, circuitry, etc.). Serviceable chassis 100 may also be a chassis for a non-electronic device where it is desirable that the chassis of non-electronic device is a smooth clean chassis without noticeable fastening components.

The following detailed description sets forth example embodiments of apparatuses, methods, and systems relating to an attachment for devices. Features such as structure(s), function(s), and/or characteristic(s), for example, are described with reference to one embodiment as a matter of convenience; various embodiments may be implemented with any suitable one or more of the described features.

For purposes of illustrating certain example techniques of serviceable chassis 100, it is important to understand the foundational information related to serviceable chassis 100. The following foundational information may be viewed as a basis from which the present disclosure may be properly explained.

One of the current technological trends is to have a sleek, smooth, aesthetically pleasing device. For example, it is desirable to have a fastener free exterior for electronic devices and at the same time allow the electronic device to be easily serviceable. To allow the electronic device to be serviceable, the chassis of the electronic device needs to be in two or more pieces so the electronics inside the electronic device can be accessible for repair or replacement. However, this typically creates problems with the fastener free exterior as fasteners are need to connect the two or more pieces. Screws and snaps are currently the primary solution to fastening two plastic chassis sides together. There are numerous snap fit and interference fit interfaces that are hidden but the problem with such designs is that they are not easily serviceable or they can be easily damaged when taken apart. The interfaces need to be tightly clamped together and for hidden fasteners this generally means they need to have a significant pull out force associated with them. Thus, when the pieces of the chassis are separated, damage normally occurs due to the pull out force. Also, the hidden fasteners typically need significant engagement and do not work well with thin systems. Also, the fasteners are typically deformed on install and if they are damaged they may be weakened and disengage later. What is needed is a sleek, smooth, aesthetically pleasing chassis that can allow access to the electronics (or non-electronic components) inside the chassis without the limitations of current systems.

A serviceable chassis, as outlined in FIGS. 1A and 1B, can resolve these issues (and others). Serviceable chassis 100 may be configured to allow for a chassis with fastener free exteriors and a relatively simple pull mechanism to service the system. Furthermore once locked together the fasteners will not loosen significantly unless disengaged purposefully during servicing. In an example, serviceable chassis 100 can include a cord or wire to engage or disengage a series of internal hidden relatively low cost fasteners or locking cams. A rotating arm on the locking cams can be used to couple the locking cam with the cord and allow for the locking cams to be rotated clockwise and counterclockwise evenly. A pull key can be used to reach into the chassis through a keyway or an opening in the chassis to grab the cord and pull it to engage or release the locking cams. The result is a low cost fastener free exterior with a pull mechanism to allow for serviceability. Serviceable chassis 100 can also be configured to allow for multiple engage and release (at least better than snaps since snaps are not reliable for multiple assemblies), low chassis height, improved tamper protection as the casual user would not be likely to know how to open the chassis, relatively easy installation, low cost, non-metallic/non-conductive cord that can be routed up, over, and around system components to accommodate the system component placement, etc.

Figure 2:
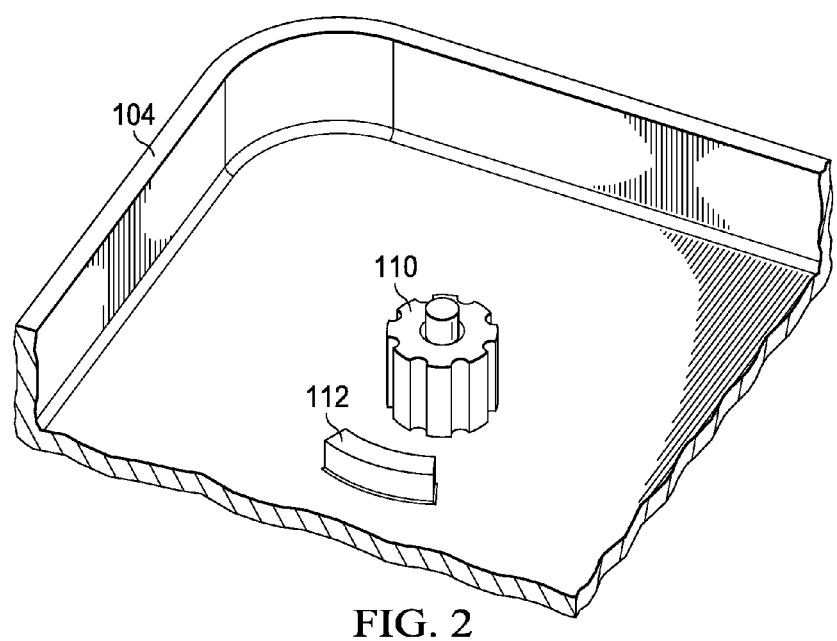
FIG. 2 is a simplified schematic diagram illustrating an orthographic view of a portion of a serviceable chassis for a device, in accordance with one embodiment of the present disclosure.

Turning to FIG. 2, FIG. 2 is a simplified orthographic view illustrating an embodiment of a portion of serviceable chassis 100. Second housing 104 can include an axle 110 and a stop feature 112. Axle 110 and stop feature 112 may be molded when second housing 104 is formed.

Figure 3A:
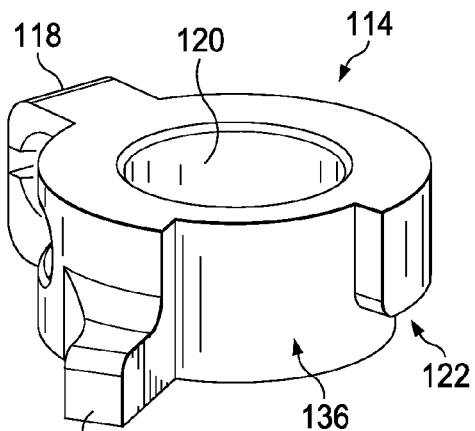
FIG. 3A is a simplified schematic diagram illustrating a plan view of a portion of a serviceable chassis for a device, in accordance with one embodiment of the present disclosure.
Figure 3B:
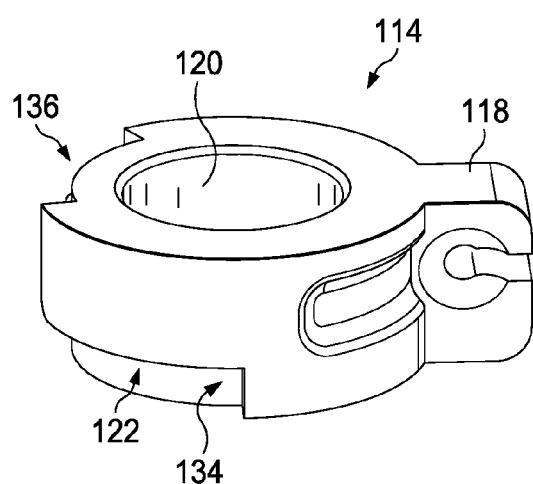
FIG. 3B is a simplified schematic diagram illustrating a plan view of a portion of a serviceable chassis for a device, in accordance with one embodiment of the present disclosure.
Figure 3C:
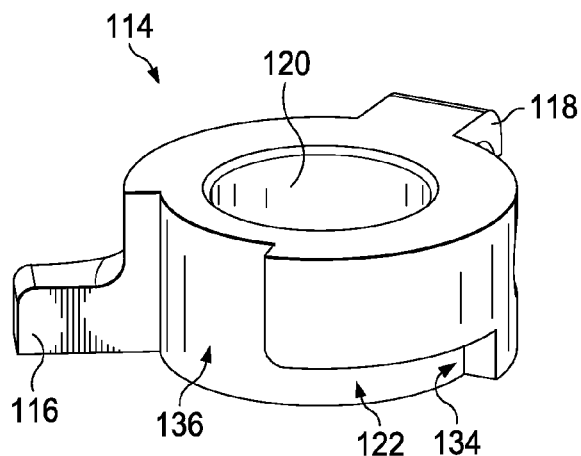
FIG. 3C is a simplified schematic diagram illustrating a plan view of a portion of a serviceable chassis for a device, in accordance with one embodiment of the present disclosure.

Turning to FIGS. 3A-3C, FIGS. 3A-3C are a simplified orthographic view illustrating an embodiment of a portion of serviceable chassis 100. Serviceable chassis 100 can include a cam lock 114. Cam lock 114 can include backstop 116, rotation arm 118, an axle bearing region 120, a locking feature 122, a forward stop 134 (illustrated in FIGS. 3B and 3B), and a locking arm channel 136. Backstop 116 can be configured to engage stop feature 112 and prevent rotation of cam lock 114. Rotation arm 118 can be configured to couple with cord 108 such that when cord 108 is pushed or pulled, cam lock 114 will rotate in the direction of the pulling or in the opposite direction of the pushing. Axle bearing region 120 can be configured to allow cam lock 114 to be placed over axle 110 such that cam lock 114 can rotate around axle 110. Locking feature 122 can include a lead in radius or angle and be configured to rotate over a capture arm 130 as is described below in FIG. 11. Forward stop 134 can limit or prevent rotation in a direction that is opposite of the direction of rotation limited or prevented by back stop 116. Locking arm channel 136 can be configured to allow a locking arm 128 (shown in FIGS. 8 and 9) to be lowered into or near locking cam 106, as illustrated in FIG. 10.

Figure 4:
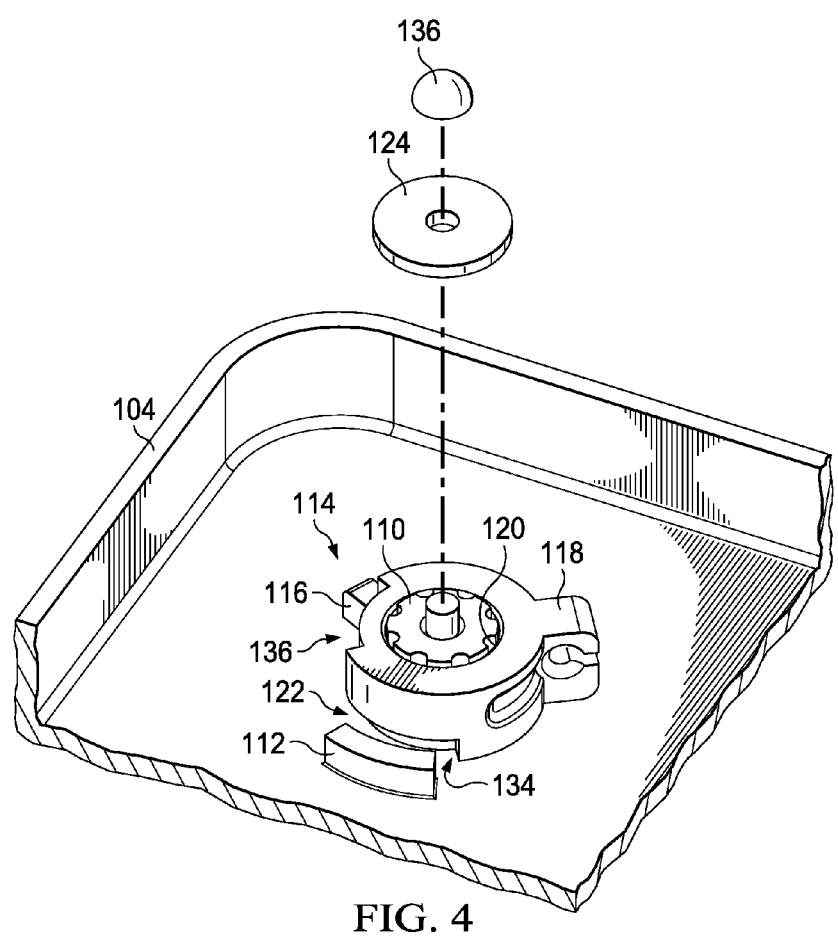
FIG. 4 is a simplified schematic diagram illustrating an orthographic view of a portion of a serviceable chassis for a device, in accordance with one embodiment of the present disclosure.

Turning to FIG. 4, FIG. 4 is a simplified orthographic view illustrating an embodiment of a portion of serviceable chassis 100. As illustrated in FIG. 4, cam lock 114 has been inserted over axle 110. In an example, retaining washer 124 may be positioned on axle 110 and over cam lock 114 to help secure cam lock 114 in place. In another example, a cap 136 may be placed over axle 110 to hold retaining washer 124 in place.

Figure 5:
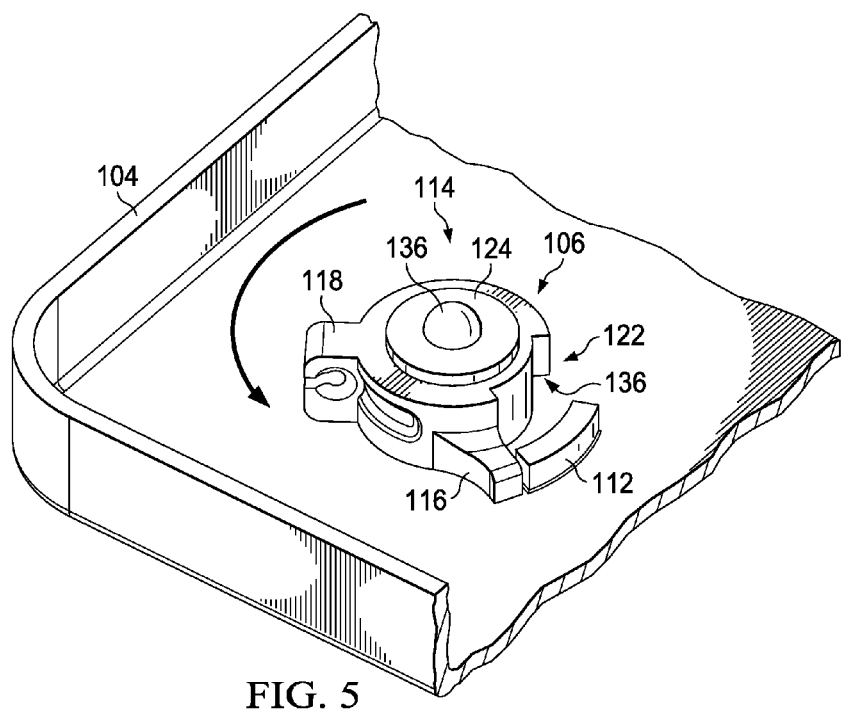
FIG. 5 is a simplified schematic diagram illustrating a plan view of a portion of a serviceable chassis for a device, in accordance with one embodiment of the present disclosure.

Turning to FIG. 5, FIG. 5 is a simplified orthographic view illustrating an embodiment of a portion of serviceable chassis 100. As illustrated in FIG. 5, cam lock 114 has been inserted over axle 110. Backstop 116 can be configured to engage stop feature 112 and prevent rotation of cam lock 114, in this example, in a counter clockwise rotation.

Figure 6:
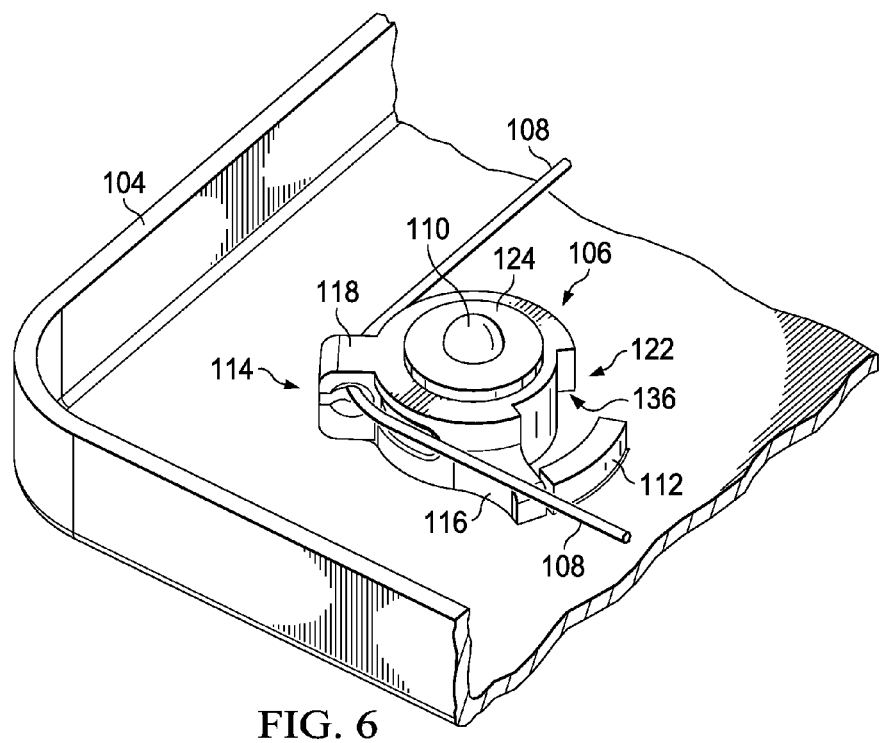
FIG. 6 is a simplified schematic diagram illustrating an orthographic view of a portion of a serviceable chassis for a device, in accordance with one embodiment of the present disclosure.

Turning to FIG. 6, FIG. 6 is a simplified orthographic view illustrating an embodiment of a portion of serviceable chassis 100. As illustrated in FIG. 6, cord 108 has been coupled to rotation arm 118. If cord 108 was pulled such that locking cam 106 was rotated in a counter clockwise rotation, backstop 116 and stop feature 112 would stop the rotation. However, if cord 108 was pulled such that locking cam 106 was rotated in a clockwise rotation, nothing would be preventing the rotation.

Figure 7:
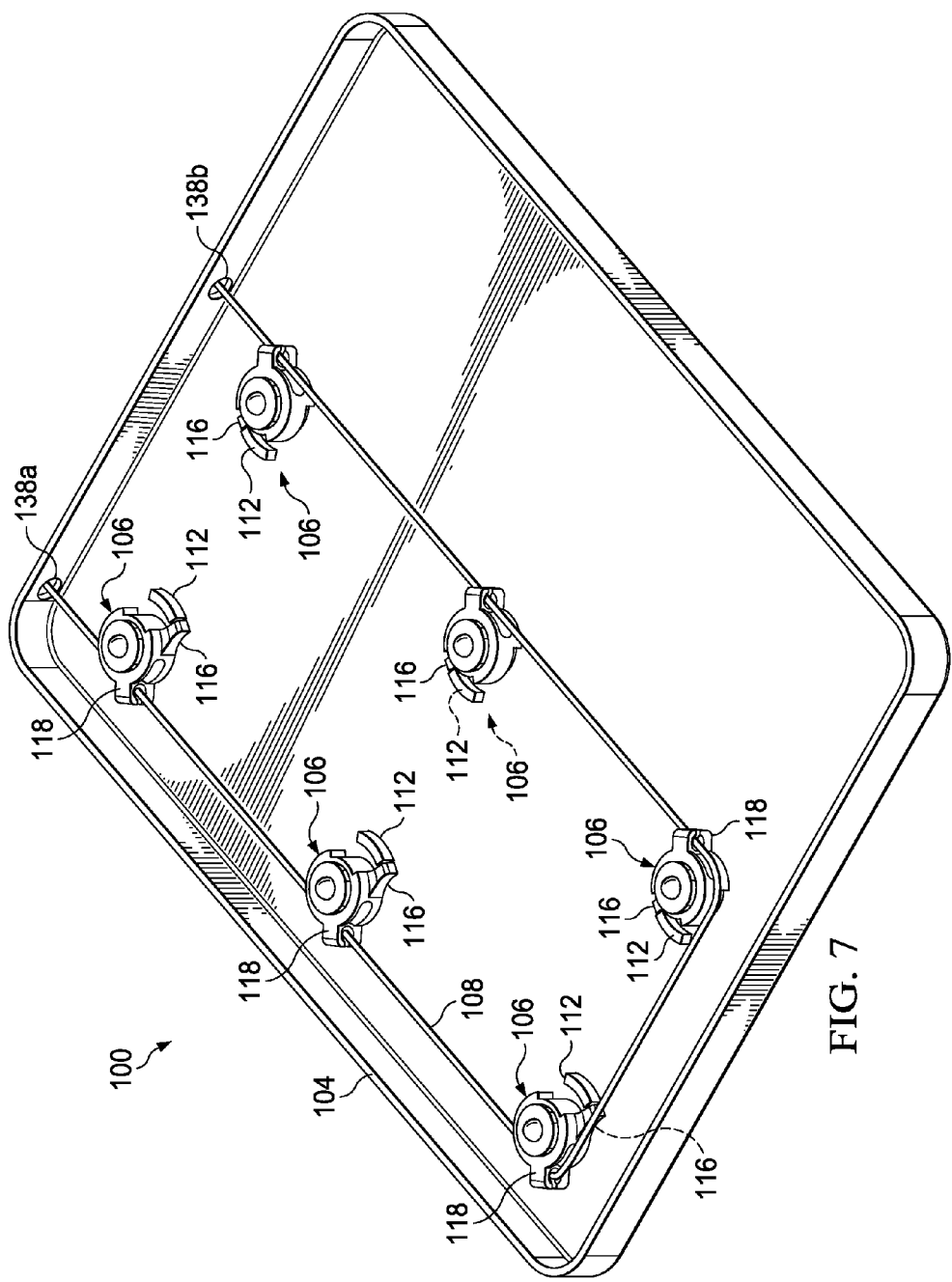
FIG. 7 is a simplified schematic diagram illustrating an orthographic view of a portion of a serviceable chassis for a device, in accordance with one embodiment of the present disclosure.

Turning to FIG. 7, FIG. 7 is a simplified orthographic view illustrating an embodiment of a portion of serviceable chassis 100. As illustrated in FIG. 7, second housing 104 can include two rows of locking cams 106. It should be noted that any number of locking cams and rows may be used to facilitate the serviceable chassis features discussed herein.

Figure 8:
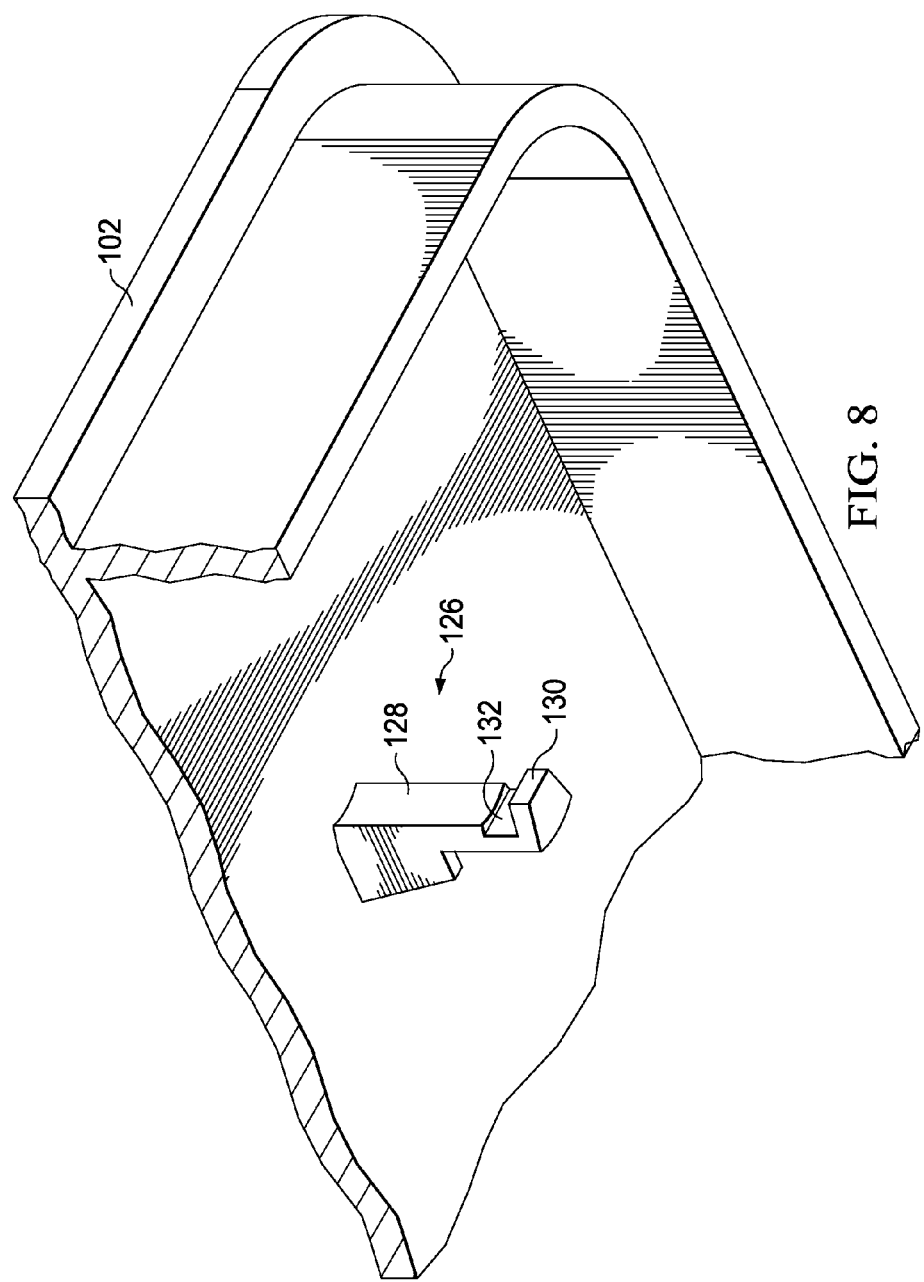
FIG. 8 is a simplified schematic diagram illustrating an orthographic view of a serviceable chassis for a device, in accordance with one embodiment of the present disclosure.

Turning to FIG. 8, FIG. 8 is a simplified orthographic view illustrating an embodiment of a portion of serviceable chassis 100. As illustrated in FIG. 8, first housing 102 includes a locking arm 126. Locking arm 126 can include a body 128, a capture arm 130, and a guide channel 132. Locking arm 126 may be injection molded on first housing 102. In an example, a cavity and lifter tooling may be used to injection mold locking arm 126 on first housing 102.

Figure 9:
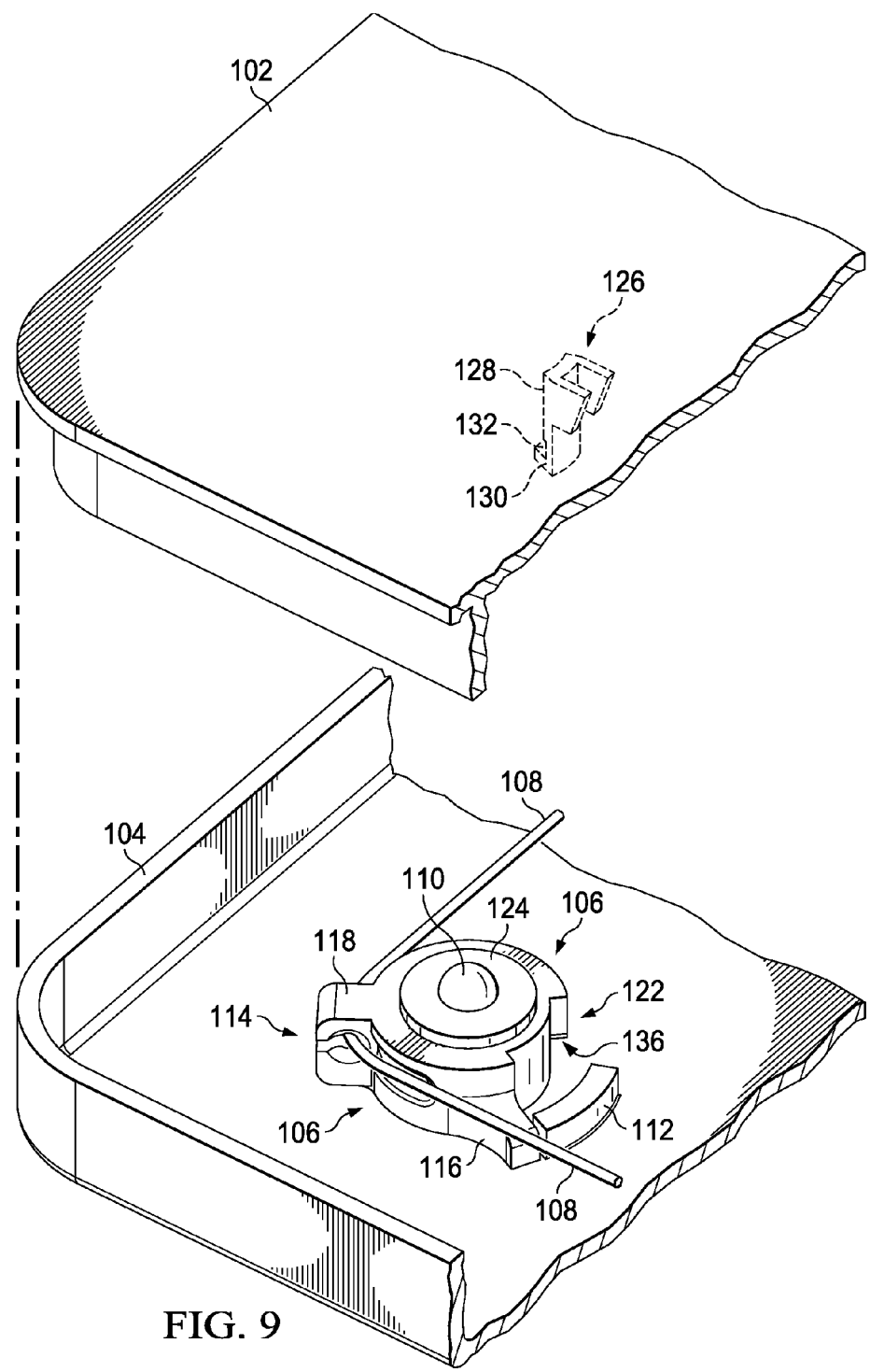
FIG. 9 is a simplified schematic diagram illustrating an orthographic view of an embodiment of a portion of a serviceable chassis for a device, in accordance with one embodiment of the present disclosure.
Figure 10:
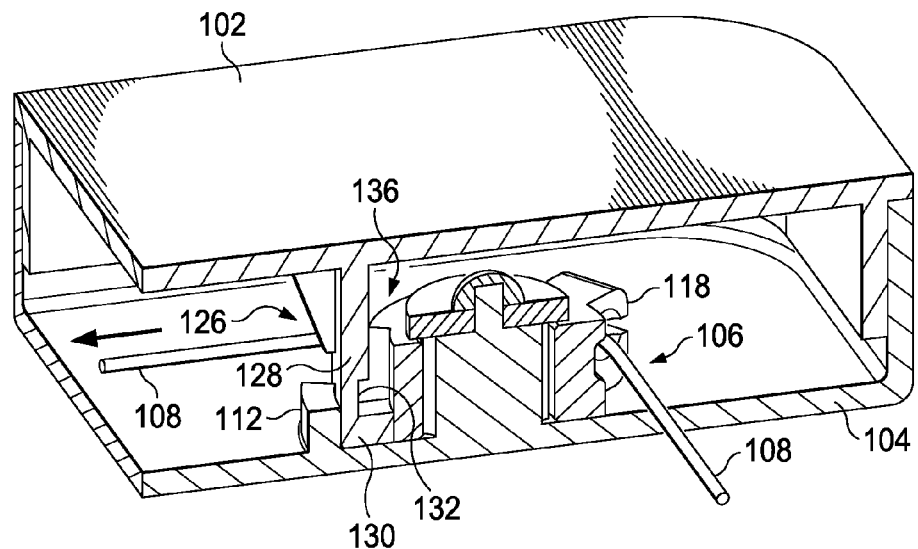
FIG. 10 is a simplified schematic diagram illustrating an orthographic view of an embodiment of a portion of a serviceable chassis for a device, in accordance with one embodiment of the present disclosure.

Turning to FIG. 9, FIG. 9 is a simplified orthographic view illustrating an embodiment of a portion of serviceable chassis 100. As illustrated in FIG. 9, first housing 102 may be lowered onto second housing 104. First housing 102 can include a plurality of locking arms 126 with each locking arm corresponding to a locking cam 106 on first housing 102. Each locking arms can line up with a corresponding locking cam 106 such that capture arm 130 slides down into or others wise rests in locking arm channel 136.

Turning to FIG. 10, FIG. 10 is a simplified cutaway view illustrating an embodiment of a portion of serviceable chassis 100. As illustrated in FIG. 10, first housing 102 has been lowered onto second housing 104. Capture arm 130 is between stop feature 112 and locking arm channel 136 of locking cam 106. In one example, capture arm may rest on the surface of second housing 102. Before first housing 102 is lowered onto second housing 104 or as first housing is being lowered onto second housing 104, cord 108 can be pulled in a direction that will rotate locking cam 106 and cause backstop 116 to come into contact with stop feature 112. This will allow body 128 and capture arm 130 to be lowered into locking arm channel 136.

Figure 11:
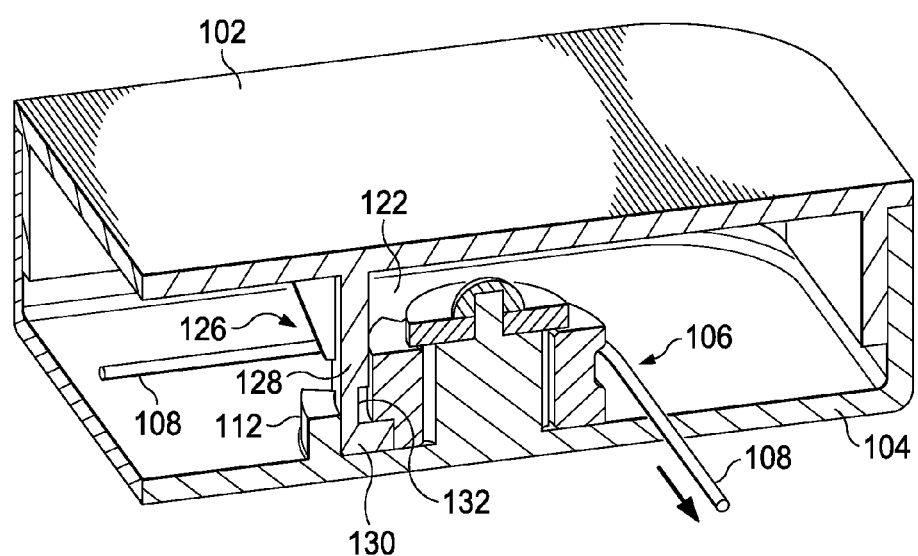
FIG. 11 is a simplified schematic diagram illustrating an orthographic view of an embodiment of a portion of a serviceable chassis for a device, in accordance with one embodiment of the present disclosure.

Turning to FIG. 11, FIG. 11 is a simplified cutaway view illustrating an embodiment of a portion of serviceable chassis 100. As illustrated in FIG. 11, first housing 102 has been lowered onto second housing 104. Cord 108 can be pulled in the opposite direction described with reference to FIG. 10. This can cause locking cam 106 to rotate until locking arm channel 136 rotates away from capture arm 130 and locking feature 122 rotates over capture arm 130 and secures first housing 102 to second housing 104. Also, when locking cam 106 is rotated and captures capture arm 130, a shallow angle on locking cam 106 and or capture arm 130 can draw the parts together and create tension in capture arm 130. This will ensure first housing 102 and second housing 104 do not separate due to common tolerances or forces experienced by serviceable chassis 100.

It is imperative to note that all of the specifications, dimensions, and relationships outlined herein (e.g., height, width, length, materials, etc.) have only been offered for purposes of example and teaching only. Each of these data may be varied considerably without departing from the spirit of the present disclosure, or the scope of the appended claims. The specifications apply only to one non-limiting example and, accordingly, they should be construed as such. In the foregoing description, example embodiments have been described. Various modifications and changes may be made to such embodiments without departing from the scope of the appended claims. The description and drawings are, accordingly, to be regarded in an illustrative rather than a restrictive sense.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 as it exists on the date of the filing hereof unless the words "means for" or "step for" are specifically used in the particular claims; and (b) does not intend, by any statement in the specification, to limit this disclosure in any way that is not otherwise reflected in the appended claims.

Other Notes and Examples

Example A1 is a serviceable chassis that includes a first housing and a second housing. The first housing includes a locking arm. The second housing can include a locking cam and a cord. The cord is attached to the locking cam and can rotate the locking cam to engage and disengage the locking arm and couple and uncouple the first housing to the second housing.

In Example A2, the subject matter of Example A1 may optionally include where the first housing includes a plurality of locking arms and the second housing includes a plurality of corresponding locking cams and the cord is configured to rotate each of the plurality of locking cams to engage and disengage a corresponding locking arm.

In Example A3, the subject matter of any of the preceding 'A' Examples can optionally include where second housing further includes a stop feature, where the stop feature is configured to prevent the locking cam from rotating past the stop feature.

In Example A4, the subject matter of any of the preceding 'A' Examples can optionally include where the locking cam includes a backstop to engage the stop feature.

In Example A5, the subject matter of any of the preceding 'A' Examples can optionally include where the locking cam includes a locking arm channel to accommodate the locking arm and allow first housing to be lowered onto second housing.

In Example A6, the subject matter of any of the preceding 'A' Examples can optionally include where the locking cam includes a locking feature that can rotate over locking arm and couple the first housing to the second housing.

Example AA1 is an electronic device that includes electronic components. The electronic components are housing in a chassis, the chassis including a first housing and a second housing. The first housing includes a locking arm. The second housing can include a locking cam and a cord. The cord is attached to the locking cam and can rotate the locking cam to engage and disengage the locking arm and couple and uncouple the first housing to the second housing.

In Example AA2, the subject matter of Example AA1 may optionally include where the first housing includes a plurality of locking arms and the second housing includes a plurality of corresponding locking cams and the cord is configured to rotate each of the plurality of locking cams to engage and disengage a corresponding locking arm.

In Example AA3, the subject matter of any of the preceding 'AA' Examples can optionally include where second housing further includes a stop feature, where the stop feature is configured to prevent the locking cam from rotating past the stop feature.

In Example AA4, the subject matter of any of the preceding 'AA' Examples can optionally include where the locking cam includes a backstop to engage the stop feature.

In Example AA5, the subject matter of any of the preceding 'AA' Examples can optionally include where the locking cam includes a locking arm channel to accommodate the locking arm and allow first housing to be lowered onto second housing.

In Example AA6, the subject matter of any of the preceding 'AA' Examples can optionally include where the locking cam includes a locking feature that can rotate over locking arm and couple the first housing to the second housing.

Example M1 is a method that includes rotating a locking cam in one direction to couple a first housing to a second housing and rotating the locking cam in an opposite direction to uncouple the first housing from the second housing. The first housing includes a locking arm, and the second housing includes the locking cam and a cord. The cord is attached to the locking cam and can rotate the locking cam to engage and disengage the locking arm to couple and uncouple the first housing to the second housing.

In Example M2, the subject matter of any of the preceding 'M' Examples can optionally include where the first housing includes a plurality of locking arms and the second housing includes a plurality of corresponding locking cams and the cord is configured to rotate each of the plurality of locking cams to engage and disengage a corresponding locking arm.

In Example M3, the subject matter of any of the preceding 'M' Examples can optionally include where second housing further includes a stop feature, wherein the stop feature is configured to prevent the locking cam from rotating past the stop feature.

In Example M4, the subject matter of any of the preceding 'M' Examples can optionally include where the locking cam includes a locking arm channel to accommodate the locking arm and allow first housing to be lowered onto second housing.

In Example M5, the subject matter of any of the preceding 'M' Examples can optionally include where the locking cam includes a locking feature that can rotate over locking arm and couple the first housing to the second housing.

An example system S1 can include a locking cam assembly to couple and uncouple a first housing to a second housing. The first housing can include a locking arm. The second housing can include a locking cam and a cord. The cord is attached to the locking cam and can rotate the locking cam to engage and disengage the locking arm and couple and uncouple the first housing to the second housing.

An example system S2 can include where the first housing includes a plurality of locking arms and the second housing includes a plurality of corresponding locking cams and the cord is configured to rotate each of the plurality of locking cams to engage and disengage a corresponding locking arm.

In Example S3, the subject matter of any of the preceding 'SS' Examples can optionally include where the locking cam includes a locking arm channel to accommodate the locking arm and allow first housing to be lowered onto second housing and a locking feature that can rotate over locking arm and couple the first housing to the second housing.

Example X1 is a machine-readable storage medium including machine-readable instructions to implement a method or realize an apparatus as in any one of the Examples A1-A6, AA1-AA6, and M1-M5. Example Y1 is an apparatus comprising means for performing of any of the Example methods M1-M5. In Example Y2, the subject matter of Example Y1 can optionally include the means for performing the method comprising a processor and a memory. In Example Y3, the subject matter of Example Y2 can optionally include the memory comprising machine-readable instructions.

What is claimed is:

1. A serviceable chassis, comprising:
   a first housing, wherein the first housing includes a locking arm; and
   a second housing, wherein the second housing includes:
     a locking cam; and
     a cord, wherein the cord is attached to the locking cam and can rotate the locking cam to engage and disengage the locking arm and couple and uncouple the first housing to the second housing.

2. The serviceable chassis of claim 1, wherein the first housing includes a plurality of locking arms and the second housing includes a plurality of corresponding locking cams and the cord is configured to rotate each of the plurality of locking cams to engage and disengage a corresponding locking arm.

3. The serviceable chassis of claim 1, wherein the second housing further includes:
   a stop feature, wherein the stop feature is configured to prevent the locking cam from rotating past the stop feature.

4. The serviceable chassis of claim 3, wherein the locking cam includes a backstop to engage the stop feature.

5. The serviceable chassis of claim 1, wherein the locking cam includes a locking arm channel to accommodate the locking arm and allow the first housing to be lowered onto the second housing.

6. The serviceable chassis of claim 1, wherein the locking cam includes a locking feature that can rotate over the locking arm and couple the first housing to the second housing.

7. An electrical device, comprising:
   electronic components, wherein the electronic components are housed in a chassis, the chassis including:
     a first housing, wherein the first housing includes a locking arm; and
     a second housing, wherein the second housing includes:
       a locking cam; and
       a cord, wherein the cord is attached to the locking cam and can rotate the locking cam to engage and disengage the locking arm and couple and uncouple the first housing to the second housing.

8. The electronic device of claim 7, wherein the first housing includes a plurality of locking arms and the second housing includes a plurality of corresponding locking cams and the cord is configured to rotate each of the plurality of locking cams to engage and disengage a corresponding locking arm.

9. The electronic device of claim 7, wherein the second housing further includes:
   a stop feature, wherein the stop feature is configured to prevent the locking cam from rotating past the stop feature.

10. The electronic device of claim 9, wherein the locking cam includes a backstop to engage the stop feature.

11. The electronic device of claim 1, wherein the locking cam includes a locking arm channel to accommodate the locking arm and allow the first housing to be lowered onto the second housing.

12. The electronic device of claim 1, wherein the locking cam includes a locking feature that can rotate over the locking arm and couple the first housing to the second housing.

13. A method, comprising:
rotating a locking cam in one direction to couple a first housing to a second housing, wherein the first housing includes a locking arm, and the second housing includes:
  the locking cam; and
  a cord, wherein the cord is attached to the locking cam and can rotate the locking cam to engage and disengage the locking arm to couple and uncouple the first housing to the second housing; and
rotating the locking cam in an opposite direction to uncouple the first housing from the second housing.

14. The method of claim 13, wherein the first housing includes a plurality of locking arms and the second housing includes a plurality of corresponding locking cams and the cord is configured to rotate each of the plurality of locking cams to engage and disengage a corresponding locking arm.

15. The method of claim 13, wherein the second housing further includes a stop feature, wherein the stop feature is configured to prevent the locking cam from rotating past the stop feature.

16. The method of claim 13, wherein the locking cam includes a locking arm channel to accommodate the locking arm and allow the first housing to be lowered onto the second housing.

17. The method of claim 13, wherein the locking cam includes a locking feature that can rotate over the locking arm and couple the first housing to the second housing.

18. A system, comprising:
a locking cam assembly to couple and uncouple a first housing to a second housing:
  the first housing including a locking arm; and
  the second housing including:
  a locking cam; and
  a cord, wherein the cord is attached to the locking cam and can rotate the locking cam to engage and disengage the locking arm and couple and uncouple the first housing to the second housing.

19. The system of claim 18, wherein the first housing includes a plurality of locking arms and the second housing includes a plurality of corresponding locking cams and the cord is configured to rotate each of the plurality of locking cams to engage and disengage a corresponding locking arm.

20. The system of claim 18, wherein the locking cam includes a locking arm channel to accommodate the locking arm and allow the first housing to be lowered onto the second housing and a locking feature that can rotate over the locking arm and couple the first housing to the second housing.

* * * * *